United States Patent

Nagai (10) Patent No.: US 7,173,485 B2
(45) Date of Patent: Feb. 6, 2007

(54) PHASE-COMPENSATED FILTER CIRCUIT WITH REDUCED POWER CONSUMPTION

(75) Inventor: Toshiaki Nagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/058,194

(22) Filed: Feb. 16, 2005

(65) Prior Publication Data
US 2006/0103560 A1    May 18, 2006

(30) Foreign Application Priority Data
Nov. 15, 2004 (JP) .............................. 2004-330895

(51) Int. Cl.
*H03F 1/36* (2006.01)
(52) U.S. Cl. ..................... 330/107; 330/257; 341/143
(58) Field of Classification Search ................ 330/107, 330/257, 260, 149, 258, 100; 341/143
See application file for complete search history.

(56) References Cited

U.S. PATENT DOCUMENTS

| | | | | |
|---|---|---|---|---|
| 4,812,779 A * | 3/1989 | Wagner | ...................... | 330/149 |
| 5,155,447 A * | 10/1992 | Huijsing et al. | ............ | 330/107 |
| 5,486,790 A * | 1/1996 | Huijsing et al. | ............ | 330/260 |
| 6,150,884 A * | 11/2000 | Fattaruso | ..................... | 330/257 |
| 6,421,257 B2 * | 7/2002 | MacKay et al. | ............ | 323/282 |
| 6,573,790 B2 * | 6/2003 | Steensgaard-Madsen | .... | 330/107 |
| 6,646,426 B2 * | 11/2003 | Terashi | ....................... | 323/285 |
| 6,750,715 B2 * | 6/2004 | Allott et al. | ................ | 330/258 |

OTHER PUBLICATIONS

Lucien J. Brecms, et al. "A 1.8-mW CMOS ΣΔ Modulator with Intergrated Mixer for A/D Conversion of IF Signals"; IEE Journal of Solid-State Circuits, vol. 35, No. 4, Apr. 2000.

* cited by examiner

Primary Examiner—Rexford Barnie
Assistant Examiner—Lam T. Mai
(74) Attorney, Agent, or Firm—Arent Fox PLLC (57) ABSTRACT

A filter circuit includes a plurality of integrator stages, each stage including a voltage-to-current converter to convert an input voltage into a current supplied to an output thereof and a capacitor coupled to the output of the voltage-to-current converter, a voltage charged in the capacitor being supplied to a next stage as an output of each stage, and a capacitor serving as a feed-forward coupling that couples the output of at least one stage of the plurality of integrator stages to a last output node.

5 Claims, 9 Drawing Sheets

PHASE-COMPENSATED FILTER CIRCUIT WITH REDUCED POWER CONSUMPTION

BACKGROUND OF THE INVENTION

1. Field of the Invention

The present invention generally relates to filter circuits, and particularly relates to an active filter circuit with a compensated phase delay and a sigma-delta A/D converter utilizing such a circuit.

2. Description of the Related Art

Sigma-delta A/D converters obtain a differential between an analog input signal and a feedback signal fed back after the D/A conversion of the digital output, and performs an A/D conversion with respect to the differential signal after the integration thereof. The circuit portion that performs the A/D conversion of the differential signal after integration may be a low-precision A/D converter having a small number of output bits. For example, a comparator having one bit output may be used for this purpose. In this case, the one-bit digital output of the comparator is D/A-converted and fed back, and a differential between the feedback signal and the analog input signal is obtained and integrated. The integration accumulates differences between the input and the output over time. When the accumulated difference between the input and the output over time exceeds the threshold of the comparator at some point in time, the output of the comparator is inverted.

The feedback signal made by performing D/A conversion on the output "1" of the comparator is 1 V, and the input signal is 0.75 V, for example. The differential, which is equal to −0.25 V, is accumulated through integration. The output of the comparator that receives the integrated signal as its input then changes from "1" to "0" at some point in time. The feed-back signal made by performing D/A conversion on the output "0" of the comparator is 0 V, for example. Since the input signal is 0.75 V, the difference is +0.75 V. The differential (+0.75V) is accumulated by integration. The output of the comparator that receives the integrated signal as its input then changes from "0" to "1" at some point in time. In this manner, the digital output alternates between "0" and "1".

A rate at which the integrated signal changes by integrating +0.75 V is three times greater than the rate at which the integrated signal changes by integrating −0.25V. As a result, the period during which +0.75 V is being accumulated, i.e., the period during which the digital output is "0", is one third of the period during which −0.25 V is being accumulated, i.e., the period during which the digital output is "1". The digital output that alternates between "0" and "1" thus has an average that is equal to 0.75, which precisely represents the input analog potential.

If the digital output is sampled, the sampled digital output in the above example becomes "111011101110 . . . ", for example. With the over-sampling of the digital output and the averaging by use of a FIR low-pass filter, therefore, the A/D conversion output is obtained with the precision commensurate with the over-sampling rate.

In this manner, the sigma-delta A/D converter provides high precision by its nature, and has an advantage in that most of the processing is performed digitally, with few analog-based parts.

Figure 1:
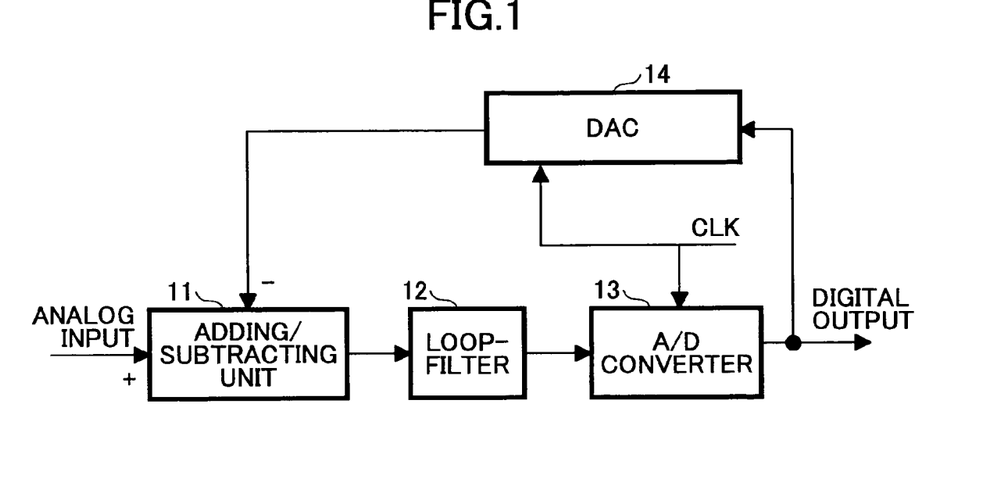
FIG. 1 is a diagram showing the construction of a sigma-delta A/D converter.

FIG. 1 is a diagram showing the construction of a sigma-delta A/D converter. A sigma-delta A/D converter 10 of FIG. 1 includes an adding/subtracting unit 11, a loop-filter 12, an A/D converter 13, and a DAC (D/A converter) 15. The A/D converter 13 and the DAC 14 operate based on a clock signal CLK. The DAC 14 performs a D/A conversion with respect to the digital output signal for provision as an analog feedback signal to the adding/subtracting unit 11. The adding/subtracting unit 11 obtains a differential between the analog input signal and the feedback signal to supply the differential signal to the A/D converter 13. The loop-filter 12 is a low-pass filter, and has the function to integrate the differential signal supplied from the A/D converter 13. The integrated signal made by integrating the differential signal is supplied from the loop-filter 12 to the A/D converter 13. The A/D converter 13 performs an A/D conversion with respect to the integrated signal for provision as a digital signal output.

The differential signal output from the adding/subtracting unit 11 corresponds to a difference between the input signal and the output signal that is left unrepresented by the limited number of bits of the digital output signal. When an accumulation of this difference grows in the integrated signal, the digital signal output of the A/D converter 13 changes at some point in time. The time period required for the accumulation of the difference and the subsequent change is reciprocal to the difference between the input signal and the output signal that is left unrepresented by the limited number of bits of the digital output signal. Accordingly, a temporal average of the digital output signal of the A/D converter 13 can represent the analog input signal with the precision that exceeds precision achievable by the limited number of bits of the digital output signal. Namely, with the provision of the digital output signal at an over-sampling rate and the averaging of the signal by use of a FIR low-pass filter, it is possible to provide an A/D converter output with the precision commensurate with the over-sampling rate.

In general, a gm-C-type filter is used as the loop-filter 12 in order to achieve desired filter characteristics. The gm-C-type filter typically has the configuration in which a voltage-to-current converting amplifier (OTA: operational transconductance amplifier) is used in the feed-forward path to compensate for phase delay (Lucien J. Breems, "A 1.8-mW CMOS ΣΔ Modulator with Integrates Mixer for A/D Conversion of IF Signals," IEEE Journal of Solid-State Circuits, Vol. 35, No. 4, 2000).

Figure 2:
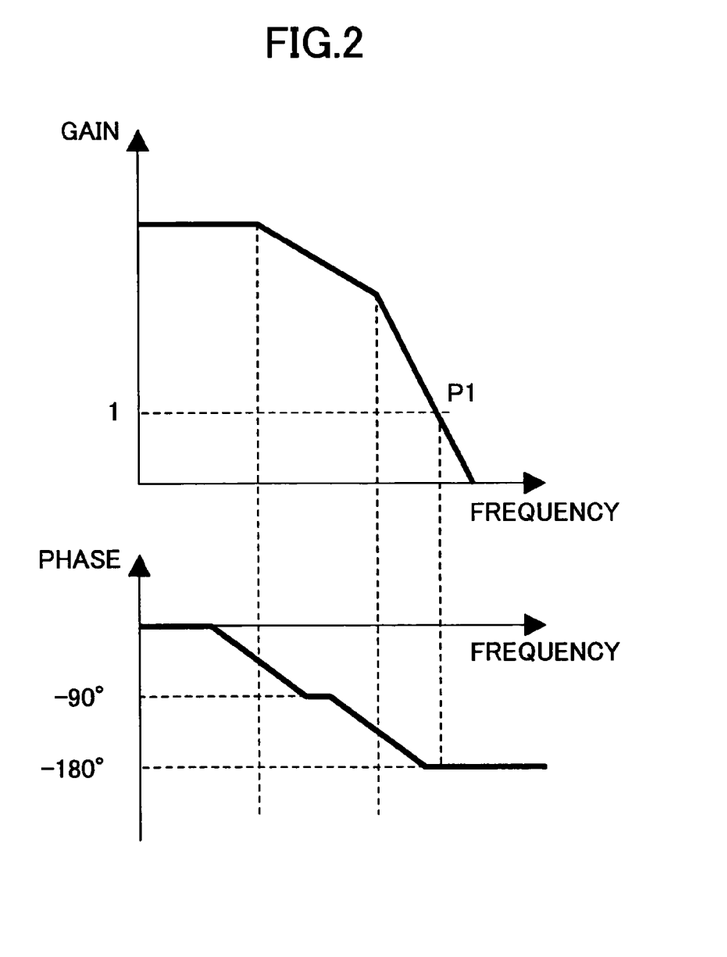
FIG. 2 is a diagram for explaining the issue of phase delay.

When a filter having a gain is used in a feedback-loop system as shown in FIG. 1, a phase delay becomes an issue. FIG. 2 is a diagram for explaining the issue of phase delay. The example shown in FIG. 2 shows a system having two poles. Around each pole, the slope of the gain decreases by 20 dB/dec, and the phase delays by 90 degrees. In a system having two or more poles, the phase ends up delaying 180 degrees on the higher-frequency side. This means that the sign of higher frequency components is reversed between the input and output of the filter with respect to the signals. If the gain is higher than 1 (0 dB) with respect to a frequency having a 180-degree phase delay, the loop undesirably oscillates. A method for compensating for such phase delay includes adding a zero.

Figure 3:
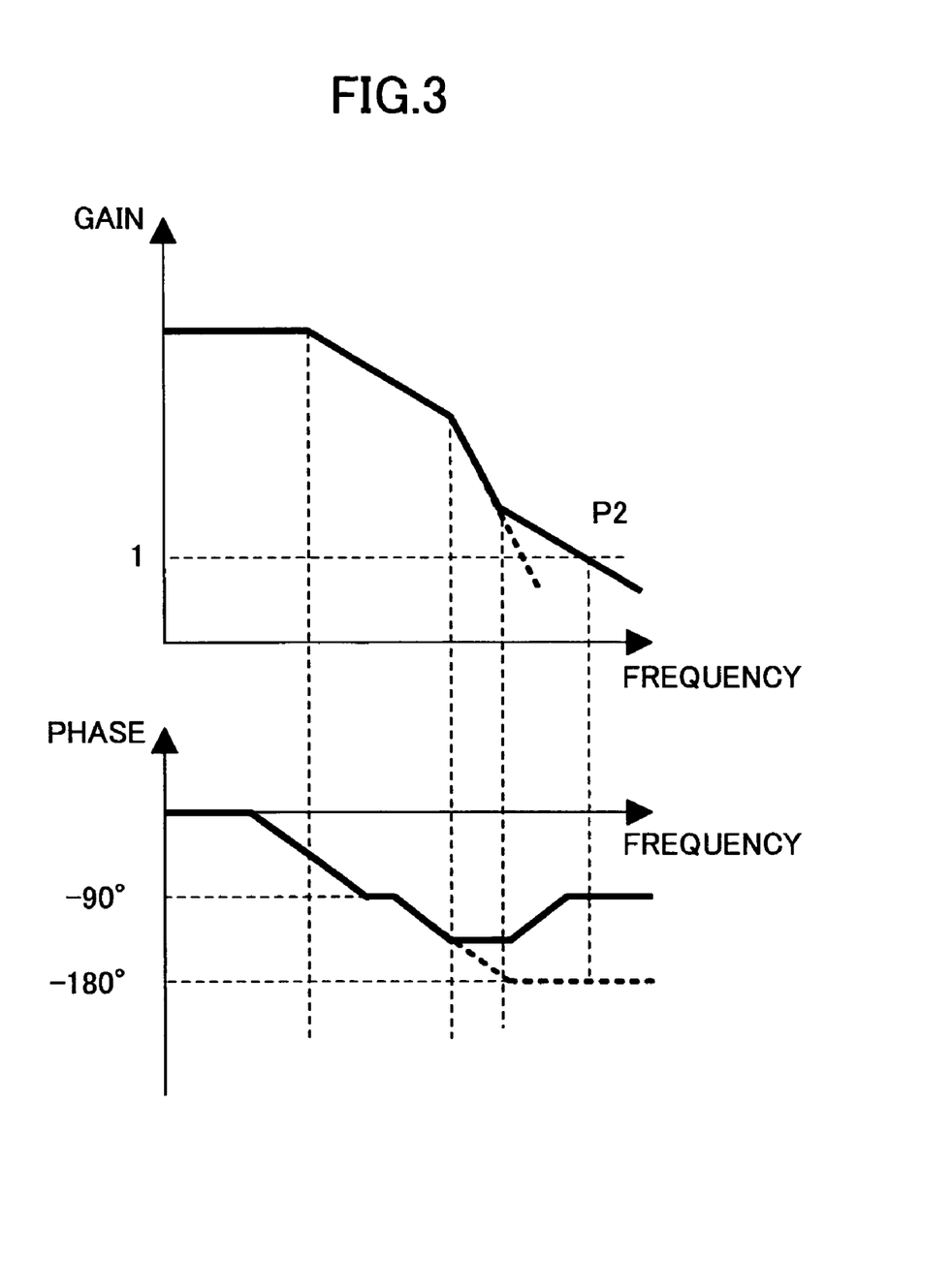
FIG. 3 is a diagram for explaining a case in which a zero is added to compensate for phase delay.

FIG. 3 is a diagram for explaining a case in which a zero is added to compensate for phase delay. Around a zero, the gain increases by 20 dB/dec, and the phase advances by 90 degrees. Accordingly, provision of zeros in the filter as many as the number of poles or one less than the number of poles makes it possible to reduce the phase to less than 180 degrees as shown in FIG. 3 while the phase had a 180-degree delay in FIG. 2.

Figure 4A:
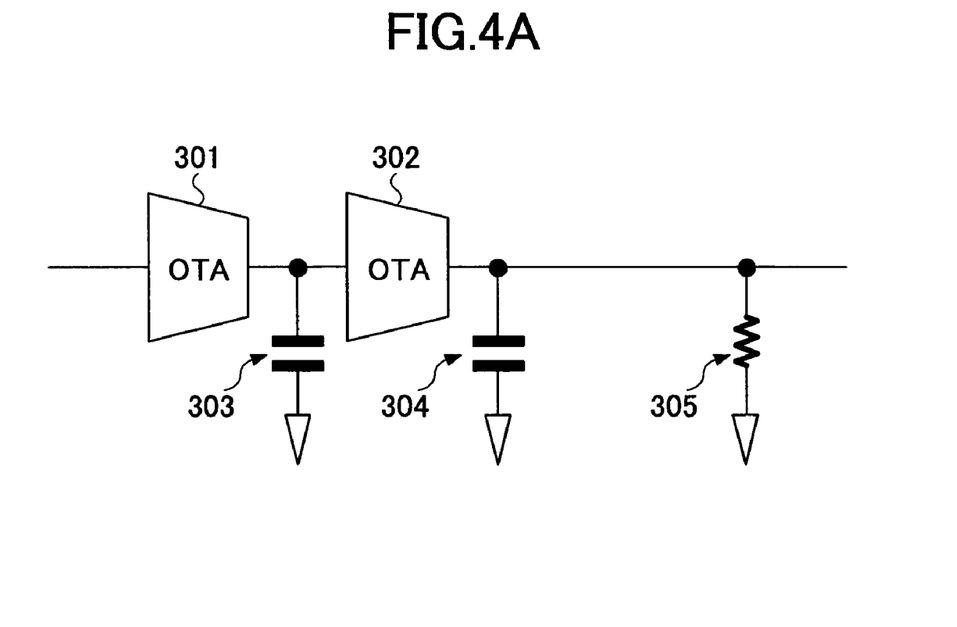
FIGS. 4A and 4B are diagrams showing a construction that compensates for phase by adding zeros in a second-order gm-C-type filter.
Figure 4B:
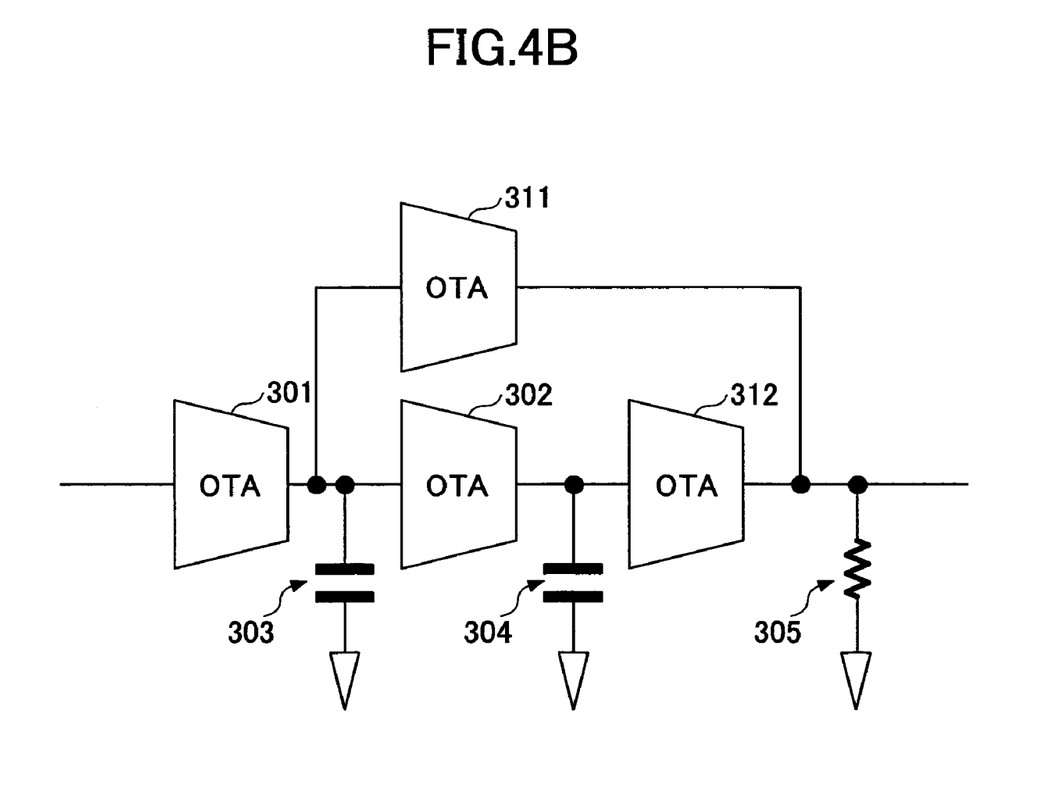

FIGS. 4A and 4B are diagrams showing a construction that compensates for phase by adding zeros in a second-order gm-C-type filter. FIG. 4A illustrates a filter for which no phase compensation is provided. This filter includes voltage-to-current converting amplifiers (OTA) 301 and 302, capacitors 303 and 304, and a resistor 305. The voltage-to-current converting amplifiers 301 and 302 each convert an input voltage signal from voltage to current so as to output a current signal. The respective output currents charge the capacitors 303 and 304 connected to the output nodes. As a result, voltages corresponding to the integration of the respective output currents are obtained. In this manner, a single voltage-to-current converting amplifier and a single capacitor together constitute a single-stage integrator (low-pass filter). The filter configuration shown in FIG. 4A has a problem in that the phase is delayed by 180 degrees on the higher frequency side.

FIG. 4B illustrates a filter for which phase is compensated for by adding zeros. This filter includes voltage-to-current converting amplifiers (OTA) 311 and 312 in addition to the voltage-to-current converting amplifiers (OTA) 301 and 302, the capacitors 303 and 304, and the resistor 305 shown in FIG. 4A. The provision of the feed-forward voltage-to-current converting amplifiers 311 and 312 makes it possible to add zeros to compensate for phase delay.

Figure 5:
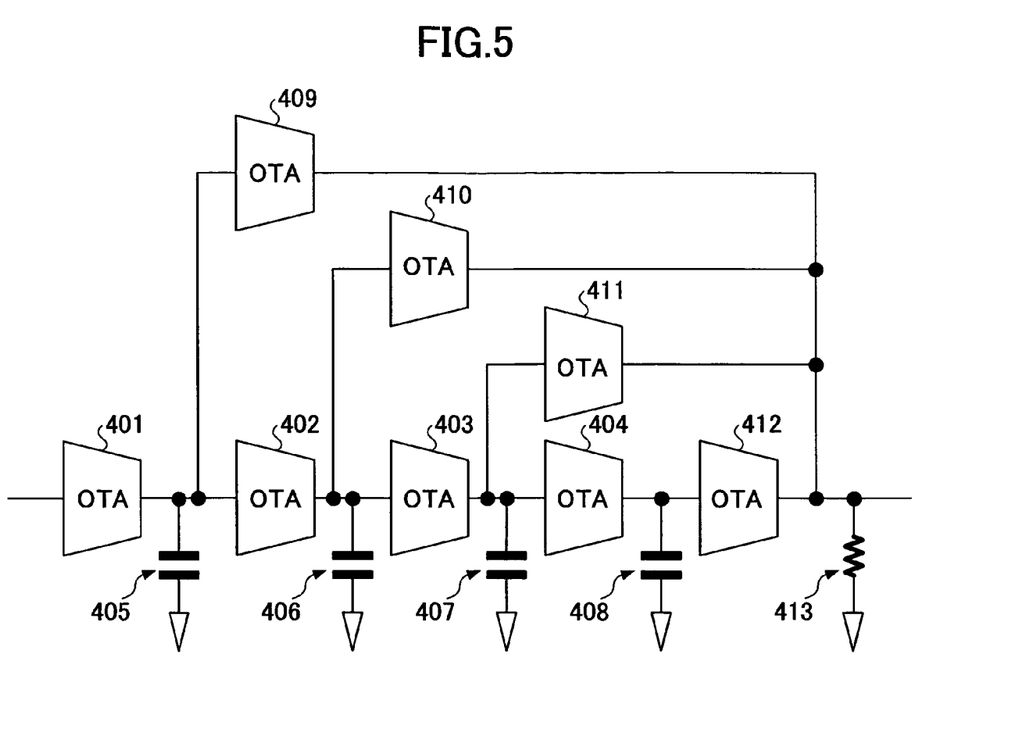

FIG. 5 is a diagram showing the construction of a fourth-order filter for which phase is compensated for. The filter shown in FIG. 5 includes voltage-to-current converting amplifiers (OTA) 401 through 404, capacitors 405 through 408, voltage-to-current converting amplifiers (OTA) 409 through 412, and a resistor 413. The provision of the feed-forward voltage-to-current converting amplifiers 409 through 412 makes it possible to add zeros to compensate for phase delay. This filter has four poles and three zeros, and is designed to have a 90-degree phase delay on the higher frequency side.

The second-order filter configuration shown in FIG. 4B uses two feed-forward voltage-to-current converting amplifiers for the purpose of phase compensation, and the fourth-order filter configuration shown in FIG. 5 uses four feed-forward voltage-to-current converting amplifiers for the purpose of phase compensation. In this manner, an n-th order filter configuration generally has n feed-forward voltage-to-current converting amplifiers added thereto. These feed-forward voltage-to-current converting amplifiers for the purpose of phase compensation consume electric power in the same manner as the voltage-to-current converting amplifiers for the purpose of integration provided at the respective stages. Accordingly, power consumption by the amplifiers doubles in the filter having the phase-compensated configuration.

Accordingly, there is a need for a gm-C-type filter that achieves phase compensation while suppressing power consumption.

SUMMARY OF THE INVENTION

It is a general object of the present invention to provide a filter circuit and a sigma-delta A/D converter that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a filter circuit and a sigma-delta A/D converter particularly pointed out in the specification in such full, clear, concise, and exact terms as to enable a person having ordinary skill in the art to practice the invention.

To achieve these and other advantages in accordance with the purpose of the invention, the invention provides a filter circuit, which includes a plurality of integrator stages, each stage including a voltage-to-current converter to convert an input voltage into a current supplied to an output thereof and a capacitor coupled to the output of the voltage-to-current converter, a voltage charged in the capacitor being supplied to a next stage as an output of each stage, and a capacitor serving as a feed-forward coupling that couples the output of at least one stage of the plurality of integrator stages to a last output node.

According to another aspect of the present invention, a sigma-delta A/D converter includes a filter circuit, which includes a plurality of integrator stages, each stage including a voltage-to-current converter to convert an input voltage into a current supplied to an output thereof and a capacitor coupled to the output of the voltage-to-current converter, a voltage charged in the capacitor being supplied to a next stage as an output of each stage, and a capacitor serving as a feed-forward coupling that couples the output of at least one stage of the plurality of integrator stages to a last output node. The sigma-delta A/D converter further includes an A/D converter having an input thereof coupled to the last output node of the filter circuit to output a digital signal, a D/A converter coupled to the output of the A/D converter to output an analog signal having a signal level responsive to the digital signal, and a differential circuit coupled to an external analog input and the output of the D/A converter to supply a differential between the external analog input and the analog signal to the filter circuit.

According to at least one embodiment of the present invention, the use of a capacitor element in place of a feed-forward voltage-to-current converting amplifier conventionally used in a feed-forward path achieves phase compensation equivalent to that achieved by the use of the feed-forward voltage-to-current converting amplifier. Since an active device is removed by replacing the feed-forward voltage-to-current converting amplifier with the capacitor element, power consumption is reduced compared with the related-art construction.

BRIEF DESCRIPTION OF THE DRAWINGS

Other objects and further features of the present invention will be apparent from the following detailed description when read in conjunction with the accompanying drawings, in which:

FIG. 5 is a diagram showing the construction of a fourth-order filter for which phase is compensated for;

DESCRIPTION OF THE PREFERRED EMBODIMENTS

In the following, embodiments of the present invention will be described with reference to the accompanying drawings.

The filter of the present invention described in the following is suitable for use as the loop-filter of a sigma-delta A/D converter. The application thereof, however, is not limited to sigma-delta A/D converters, and the present invention is applicable to gm-C-type filters in general.

Figure 6:
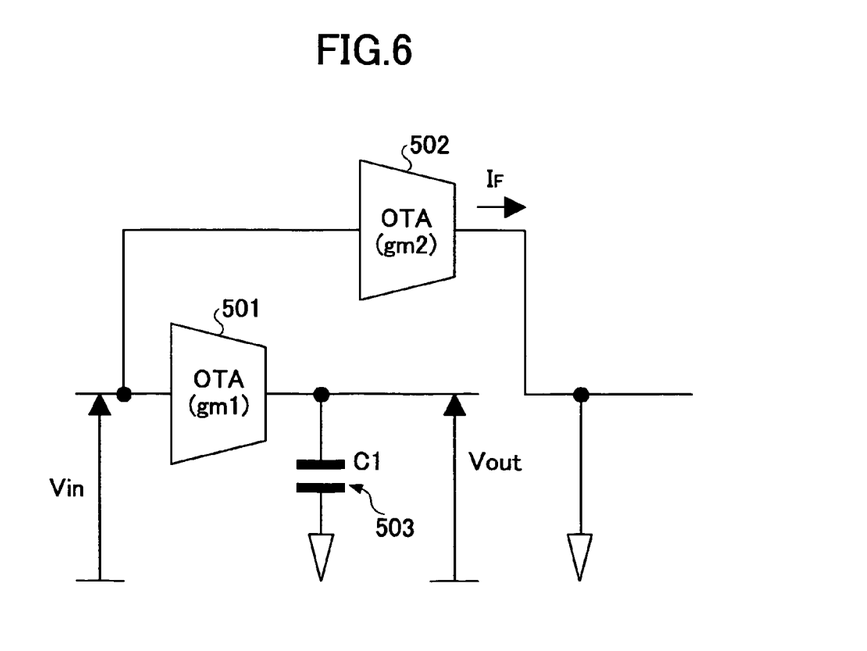
FIG. 6 is a partial view of a related-art filter showing a single-stage integrator and a corresponding feed-forward section.
Figure 7:
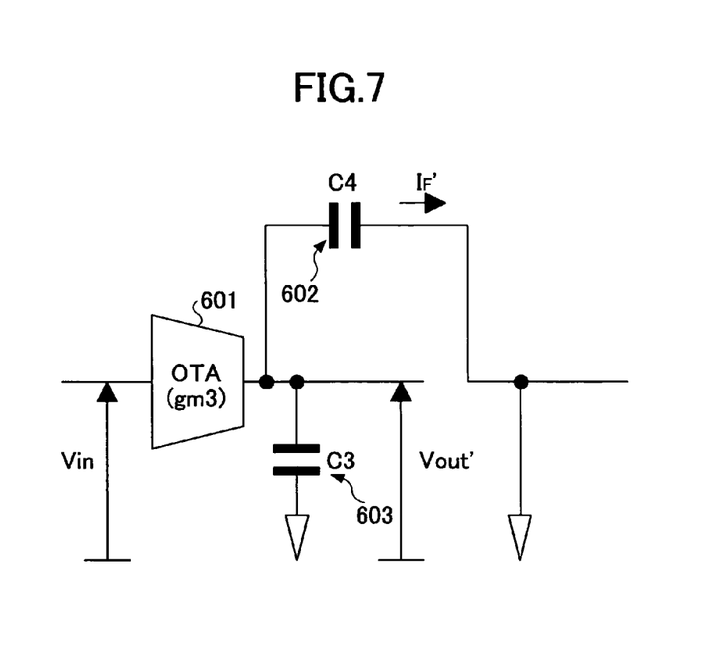
FIG. 7 is a circuit diagram showing the circuit construction of a single-stage integrator and a corresponding feed-forward section according to the present invention.

FIG. 6 is a partial view of a related-art filter showing a single-stage integrator and a corresponding feed-forward section. FIG. 7 is a circuit diagram showing the circuit construction of a single-stage integrator and a corresponding feed-forward section according to the present invention.

The construction shown in FIG. 6 corresponds to the voltage-to-current converting amplifiers 402 and 410 and the capacitor 406 of the related-art filter shown in FIG. 5, for example. The construction of FIG. 6 includes voltage-to-current converting amplifiers (OTA) 501 and 502 and a capacitor 503. For the sake of simplicity of explanation, the output of the voltage-to-current converting amplifier 502 is assumed to be coupled directly to the ground without having an intervening output resistor. The impedance of the capacitor 503 is $1/sC1$. An output voltage Vout (i.e., an input to the next stage) and a feed-forward current $I_F$ are represented as:

$$Vout = (gm1/sC1)Vin \quad (1)$$

$$I_F = gm2 \cdot Vin \quad (2).$$

Here, gm1 and gm2 are the mutual conductance of the voltage-to-current converting amplifiers 501 and 502, respectively.

The configuration of FIG. 7 according to the present invention includes a voltage-to-current converting amplifier (OTA) 601 and capacitors 602 and 603. The impedance of the capacitor 603 is $1/sC3$, and the impedance of the capacitor 602 is $1/sC4$. An output voltage Vout' (i.e., an input to the next stage) and a feed-forward current $I_F'$ are represented as:

$$Vout' = (gm3/sC3) \cdot (C3/(C3+C4)) \cdot Vin \quad (3)$$

$$I_F' = (C4/(C3+C4)) \cdot gm3 \cdot Vin \quad (4).$$

Here, gm is the mutual conductance of the voltage-to-current converting amplifier 601.

In the above equations, C3 and C4 are selected such that Vout=Vout' and $I_F=I_F'$ are satisfied. This allows the construction of FIG. 7 according to the present invention to achieve the same input/output characteristics as those of the related-art construction shown in FIG. 6. Namely, the voltage-to-current converting amplifier 502 of the construction shown in FIG. 6 outputs the current $I_F$ having the amount corresponding to level of the input voltage Vin. In the construction shown in FIG. 7 according to the present invention, on the other hand, the output voltage Vout' made by integrating the input voltage Vin is coupled to the capacitor 602, thereby letting the capacitor 602 generate a current (=C4(dV/dt)) proportional to a differential of the voltage Vout'. Differentiation of the output voltage Vout' in this manner cancels out the integration of the input voltage Vin, thereby letting the capacitor 602 generate the current $I_F'$ having the amount corresponding to the level of the input voltage Vin.

In reality, the output of the filter is not directly connected to the ground, but is connected to the ground through an intervening load impedance. If the load impedance is sufficiently small compared with surrounding impedances, the above equations properly approximate the filter characteristics.

The present invention as described above employs a capacitor element in place of a feed-forward voltage-to-current converting amplifier, and achieves phase compensation equivalent to that achieved by the use of the feed-forward voltage-to-current converting amplifier. Since an active device is removed by replacing the feed-forward voltage-to-current converting amplifier with the capacitor element, the present invention can reduce power consumption by a corresponding amount.

Figure 8:
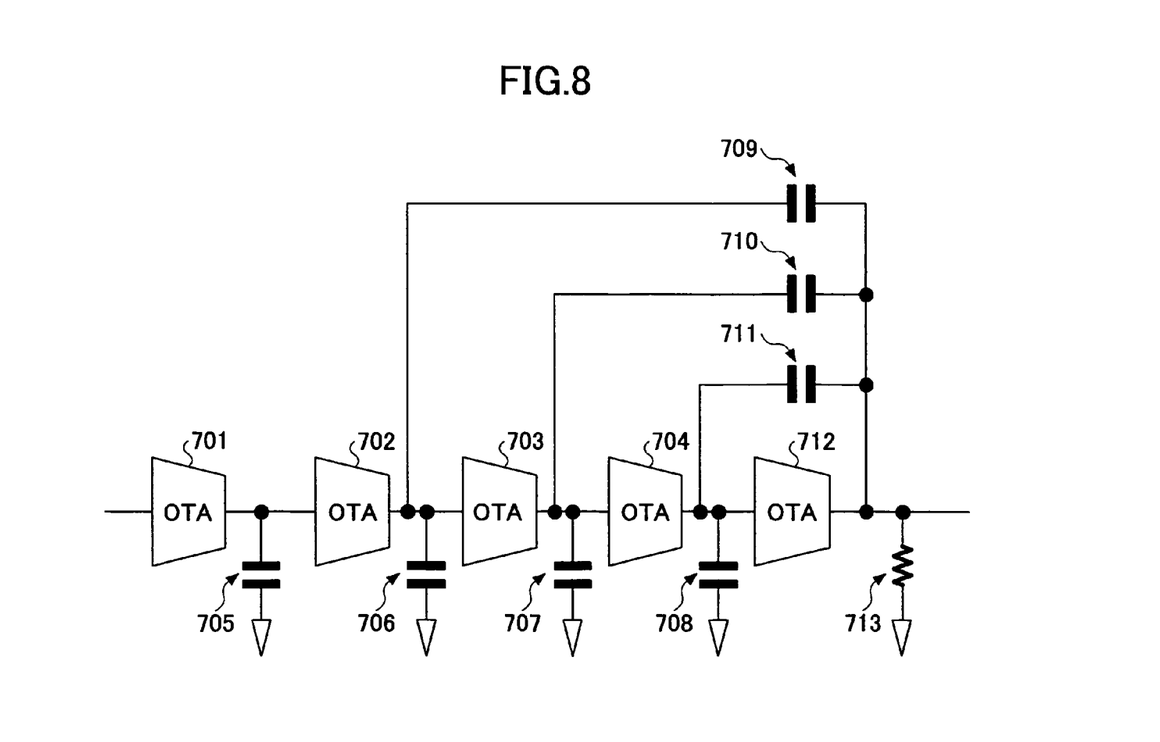
FIG. 8 is a circuit diagram showing the construction of a filter according to the present invention that achieves equivalent characteristics to the related-art filter of FIG. 5.

FIG. 8 is a circuit diagram showing the construction of a filter according to the present invention that achieves equivalent characteristics to the related-art filter of FIG. 5. The filter of FIG. 8 includes voltage-to-current converting amplifiers 701 through 704, integration capacitors 705 through 708, feed-forward capacitors 709 through 711, and a feed-forward voltage-to-current converting amplifier 712, and a load resistor 713.

The feed-forward capacitor 709 generates a feed-forward current equivalent to the output current of the feed-forward voltage-to-current converting amplifier 409 shown in FIG. 5. The feed-forward capacitor 710 generates a feed-forward current equivalent to the output current of the feed-forward voltage-to-current converting amplifier 410 shown in FIG. 5. The feed-forward capacitor 711 generates a feed-forward current equivalent to the output current of the feed-forward voltage-to-current converting amplifier 411 shown in FIG. 5. Further, the feed-forward voltage-to-current converting amplifier 712 corresponds to the feed-forward voltage-to-current converting amplifier 412 shown in FIG. 5.

In the construction shown in FIG. 8, the feed-forward voltage-to-current converting amplifier 712 cannot be replaced by a capacitor because it is located at the last stage. Since a voltage-to-current converting amplifier is an amplifier that converts a voltage to a current, it can easily be replaced by a resistor element.

Figure 9:
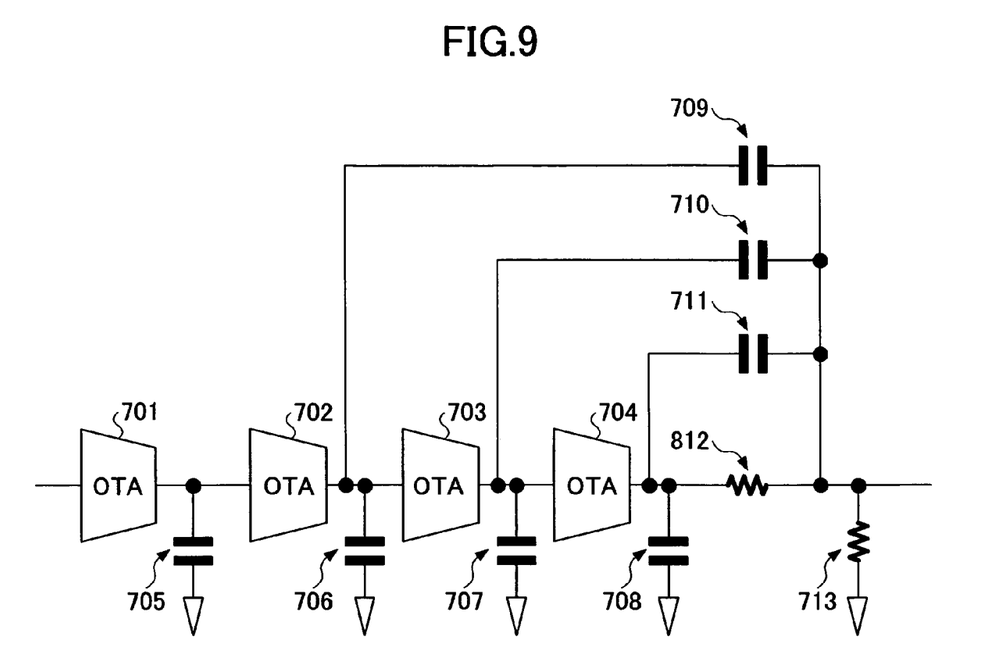
FIG. 9 is a diagram showing a variation of the filter shown in FIG. 8.

FIG. 9 is a diagram showing a variation of the filter shown in FIG. 8. In FIG. 9, the same elements as those of FIG. 8 are referred to by the same numerals, and a description thereof will be omitted. In FIG. 9, a resistor element 812 is used in place of the feed-forward voltage-to-current converting amplifier 712. The resistor element 812 lets a current flow in the amount proportional to a voltage drop across the resistor in response to the voltage at the input side (where the feed-forward voltage-to-current converting amplifier 704 is situated). The replacement of the voltage-to-current converting function by the resistor element 812 makes it possible to further reduce the number of active devices, thereby further suppressing the power consumption.

Figure 10:
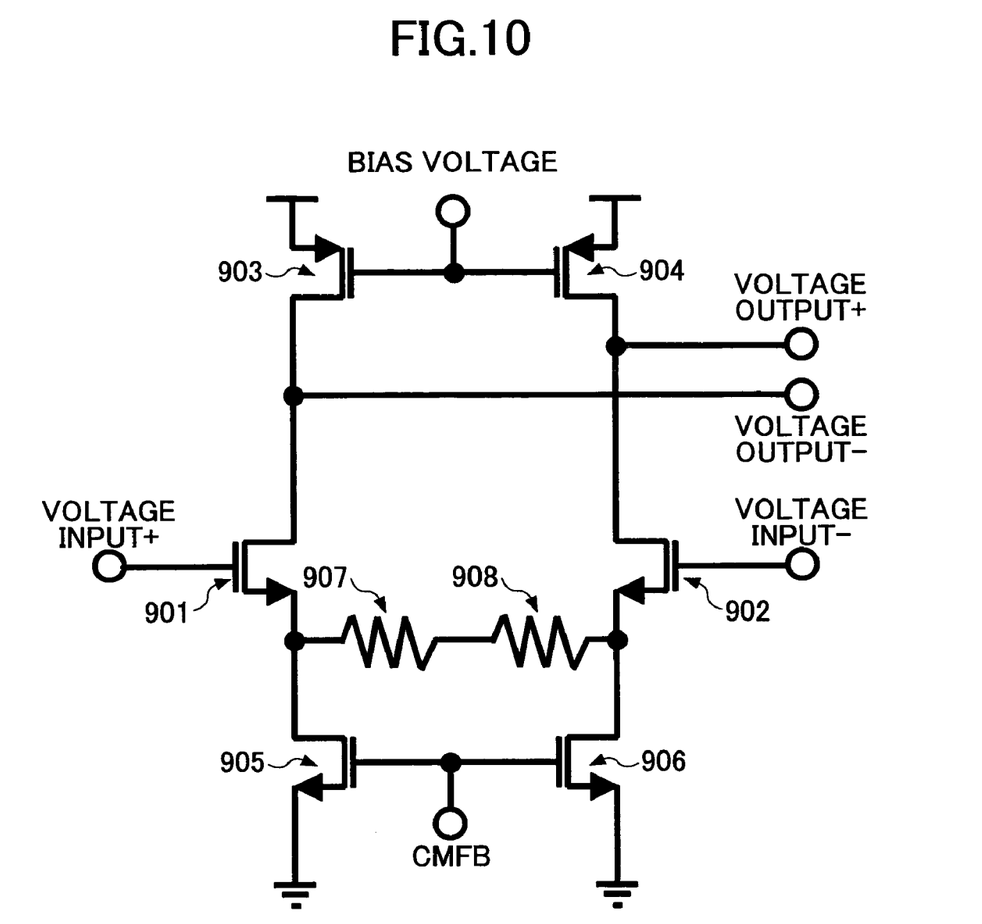
FIG. 10 is a circuit diagram showing an example of the circuit construction of a voltage-to-current converting amplifier.

FIG. 10 is a circuit diagram showing an example of the circuit construction of a voltage-to-current converting amplifier. The voltage-to-current converting amplifier shown in FIG. 10 demonstrates a configuration in which differential inputs and differential outputs are used.

The voltage-to-current converting amplifier of FIG. 10 includes NMOS transistors 901 and 902 forming an input differential pair, PMOS transistors 903 and 904 serving as a current source pair, NMOS transistors 905 and 906 serving as a current source pair, and voltage-to-current converting resistors 907 and 908. The NMOS transistors 901 and 902 forming an input differential pair function as a source follower. Accordingly, a voltage difference proportional to the input voltage difference is applied to the opposite ends of the series of the resistors 907 and 908, resulting in a current responsive to this voltage difference flowing through the resistors 907 and 908.

The voltage-to-current converting amplifier of FIG. 10 performs a amplification operation, with biases being applied by the PMOS transistors 903 and 904 and the NMOS transistors 905 and 906. The gates of the NMOS transistors 905 and 906 receive common feedback (CMFB). The currents running through the PMOS transistors 903 and 904 are the same amount, and the currents running through the NMOS transistors 905 and 906 are also the same amount. As a result, a current equal to the current flowing though the voltage-to-current converting resistors 907 and 908 is output as a differential current output. This achieves a voltage-to-current conversion.

Figure 11:
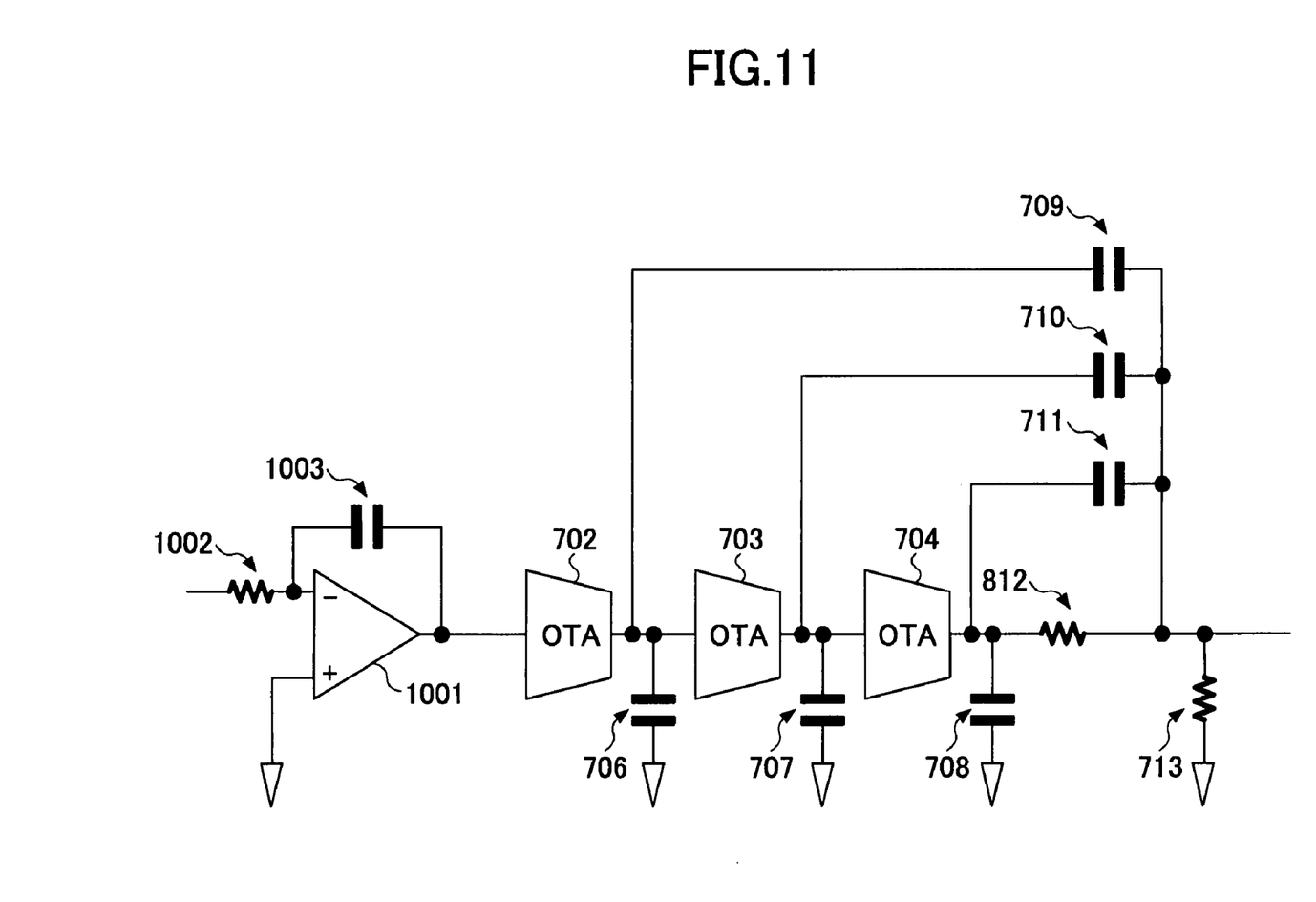
FIG. 11 is a circuit diagram showing a further variation of the filter having the construction shown in FIG. 9.

FIG. 11 is a circuit diagram showing a further variation of the filter having the construction shown in FIG. 9. In FIG. 11, the same elements as those of FIG. 9 are referred to by the same numerals, and a description thereof will be omitted.

In the construction shown in FIG. 11, an operational amplifier 1001, a resistor 1002, and a capacitor 1003 are provided in place of the voltage-to-current converting amplifier 701 and the capacitor 705 constituting the first stage integrator in FIG. 9. The operational amplifier 1001, resistor 1002, and capacitor 1003 together form a RC active filter. The resistor 1002 generates a current corresponding to the input voltage, and this current is supplied to the capacitor 1003 to generate a voltage that is an integration of the input voltage. The use of the RC active filter at the first stage of the filter improves the distortion characteristics of the first stage of the filter.

Figure 12:
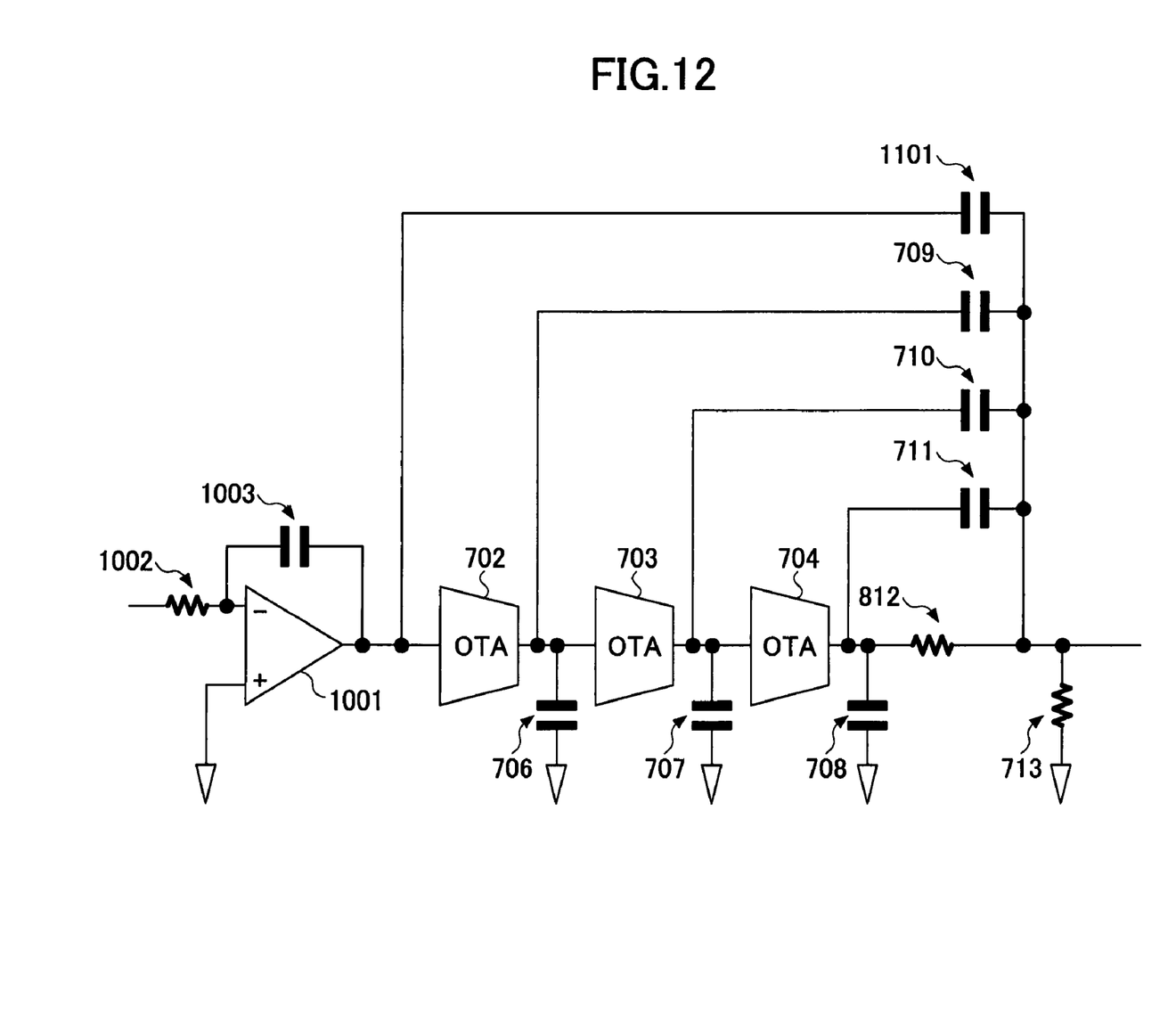
FIG. 12 is a circuit diagram showing a further variation of the filter having the construction shown in FIG. 11.

FIG. 12 is a circuit diagram showing a further variation of the filter having the construction shown in FIG. 11. In FIG. 12, the same elements as those of FIG. 11 are referred to by the same numerals, and a description thereof will be omitted.

In the construction shown in FIG. 12, a feed-forward path is additionally provided that extends from the output of the active filter at the first stage of the filter. The provision of the additional feed-forward path and a capacitor for compensating for phase makes it possible to set the phase delay to 0 degree rather than to 90 degrees on the higher frequency side. This further improves the filter characteristics.

The filter illustrated in FIG. 11 has fourth-order characteristics for lower frequencies and first-order characteristics for higher frequencies. The filter illustrated in FIG. 12 has fourth-order characteristics for lower frequencies and 0th-order characteristics for higher frequencies. These filters are applicable to higher-order sigma-delta A/D converters.

Further, the present invention is not limited to these embodiments, but various variations and modifications may be made without departing from the scope of the present invention.

The present application is based on Japanese priority application No. 2004-330895 filed on Nov. 15, 2004, with the Japanese Patent Office, the entire contents of which are hereby incorporated by reference.

What is claimed is:

1. A filter circuit, comprising:
   a plurality of integrator stages, each stage including a voltage-to-current converter to convert an input voltage into a current supplied to an output thereof and a capacitor coupled to the output of the voltage-to-current converter, a voltage charged in the capacitor being supplied to a next stage as an output of each stage;
   a capacitor serving as a feed-forward coupling that couples the output of at least one stage of said plurality of integrator stages to a last output node; and
   a voltage-to-current converter having an input thereof coupled to the output of a last stage of said plurality of integrator stages and an output thereof coupled to said last output node,
   wherein the voltage-to-current converter having the output thereof coupled to the last output node is a resistor.

2. The filter circuit as claimed in claim 1, wherein the capacitor serving as a feed-forward coupling has one end thereof connected to the output of said at least one stage of said plurality of integrator stages, and has another end thereof connected to the last output node.

3. The filter circuit as claimed in claim 1, wherein the output of each stage of said plurality of integrator stages, except for the output of a first stage, is coupled to the last output node by a feed-forward coupling through a capacitor.

4. The filter circuit as claimed in claim 3, further comprising a capacitor serving as a feed-forward coupling that couples the output of the first stage of said plurality of integrator stages to the last output node.

5. A filter circuit, comprising:
   a plurality of integrator stages, each stage including a voltage-to-current converter to convert an input voltage into a current supplied to an output thereof and a capacitor coupled to the output of the voltage-to-current converter, a voltage charged in the capacitor being supplied to a next stage as an output of each stage; and
   a capacitor serving as a feed-forward coupling that couples the output of at least one stage of said plurality of integrator stages to a last output node,
   wherein a first integrator stage of said plurality of integrator stages includes:
   an operational amplifier;
   a resistor coupled to an input of the operational amplifier; and
   a capacitor coupling an output of the operational amplifier to the input of the operational amplifier.

* * * * *